United States Patent
Carvalho et al.

(10) Patent No.: US 10,069,467 B1
(45) Date of Patent: Sep. 4, 2018

(54) APPARATUS FOR QUANTIZED LINEAR AMPLIFICATION WITH NONLINEAR AMPLIFIERS

(71) Applicants: Paulo Carvalho, Lisbon (PT); Marko Beko, Alfragide (PT); Rui Dinis, Costa da Caparica (PT); João Guerreiro, V.N. Azeitao (PT); Pedro Viegas, Linda-a-Pastora (PT)

(72) Inventors: Paulo Carvalho, Lisbon (PT); Marko Beko, Alfragide (PT); Rui Dinis, Costa da Caparica (PT); João Guerreiro, V.N. Azeitao (PT); Pedro Viegas, Linda-a-Pastora (PT)

( * ) Notice: Subject to any disclaimer, the term of this patent is extended or adjusted under 35 U.S.C. 154(b) by 0 days.

(21) Appl. No.: 15/446,286

(22) Filed: Mar. 1, 2017

(51) Int. Cl.
*H03F 3/38* (2006.01)
*H03F 1/32* (2006.01)
*H03F 1/02* (2006.01)
*H03F 3/20* (2006.01)

(52) U.S. Cl.
CPC ............ *H03F 1/32* (2013.01); *H03F 1/0294* (2013.01); *H03F 3/20* (2013.01)

(58) Field of Classification Search
CPC .................................. H03F 3/38; H03F 3/217
USPC ................................................. 330/10, 207 A
See application file for complete search history.

(56) References Cited

U.S. PATENT DOCUMENTS

| | | | | |
|---|---|---|---|---|
| 8,299,866 B2 * | 10/2012 | Kim | ........................ | H03K 7/08 330/10 |
| 8,362,832 B2 * | 1/2013 | Kim | ....................... | H03G 3/007 330/10 |

* cited by examiner

*Primary Examiner* — Steven J Mottola

(57) ABSTRACT

An apparatus for quantized linear amplification with nonlinear amplifiers that performs a linear amplification of variable-envelope single carrier (SC) or multi-carrier (MC) bandpass signals, based on sampled and quantized versions of its complex envelope, where the quantizer generates $N_b$ bits that are mapped into $N_m \leq N_b$ polar components, in which the quantized symbol can be decomposed, that are modulated as $N_m$ constant or quasi constant envelope signals and where each one is amplified by a nonlinear amplifier.

6 Claims, 1 Drawing Sheet

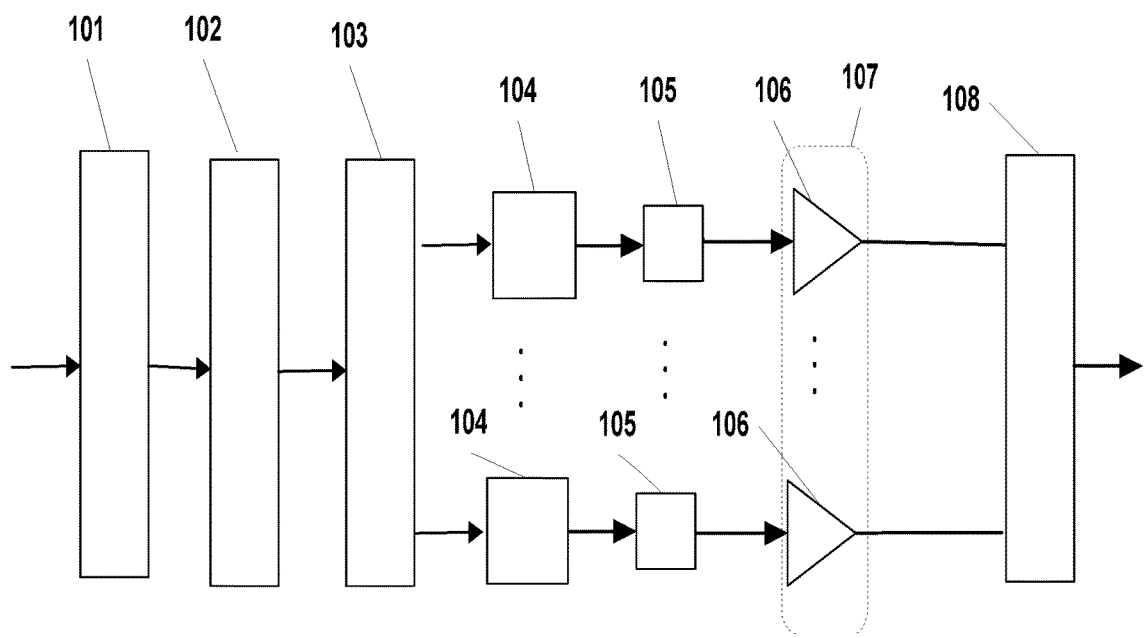

APPARATUS FOR QUANTIZED LINEAR AMPLIFICATION WITH NONLINEAR AMPLIFIERS

BACKGROUND OF THE INVENTION

Field of the Invention

The present invention relates to power amplification apparatus for use in telecommunication systems. More particularly, the present invention relates to an amplification apparatus applicable to SC modulations and/or MC modulations with envelope fluctuations, which avoids nonlinear effects regardless the envelope fluctuations of the signals at the quantizer input. The power amplification apparatus quantizes the samples and makes use of a decomposition of the quantized signal into $N_m \leq N_b$ constant envelope components and an architecture with $N_m \leq N_b$ amplifiers, in parallel, that amplifies the constant envelope components, while avoiding nonlinear distortion effects in the resulting signals.

Description of Related Art

Modern wired and wireless communications systems need to meet strictly requirements regarding spectral and power efficiencies. This is especially important for high and very high bit rate communication systems where spectral efficiency can be achieved by MC or SC modulations based on large constellations. This is particularly important for systems that also require high spectral efficiencies (i.e., large constellations), which not only have higher power requirements but are also associated to signals with higher envelope fluctuations and higher peak-to-average power ratio (PAPR), which leads to lower amplification efficiency [1]. Therefore, efficient power amplification is critical for present and next generation of high bit rate communication systems, such as 5G [2, 3].

Another problem associated to broadband communications lies on the frequency selectivity of the channel. Orthogonal frequency-division multiplexing (OFDM) became popular due its low-complexity implementation based on fast Fourier transform algorithms (FFT) and simple equalization performed in the frequency-domain [4]. However, OFDM has also disadvantages such as the high PAPR [5] that hinders it to be used in power-limited applications. As the number of subcarriers increases, also grows the possibility of having a signal with high amplitude peaks in the time-domain. If such resulting signals are transmitted through non-linear high power amplifiers (HPAs), as the ones used in Wi-Fi devices, modems and mobile phones, the high amplitude peaks will cause distortions and loss of orthogonality between the subcarriers. The outcome is inter-carrier interference (ICI) [6] and high out-of-band (OOB) radiation. ICI can cause degradation of the symbol error rate (SER) performance and increased adjacent channel interference [7]. Raising the input power back-off (IBO) reduces the non-linear distortions at the expense of reduced power efficiency, which clearly cannot be applied to energy-limited devices [8].

Several PAPR reduction algorithms have been proposed in recent years. These schemes can be divided into two major groups: i) with signal distortion and; ii) with signal scrambling. The algorithms of the first group reduce the PAPR by introducing a known and controllable distortion in the OFDM signal before the amplification. Most common signal distortion algorithms are clipping and filtering [9-12] and companding [13-16]. Signal distortion algorithms can significantly reduce the PAPR of the OFDM symbols, but they also introduce in-band and OOB interference that may reduce the overall system performance. Signal scrambling algorithms, on the other hand, reduce the PAPR without distorting the OFDM signal at cost of a higher transmitter and receiver complexity. Selective mapping (SLM) [17-19], partial transmit sequence (PTS) [20-22] and Walsh-Hadamard transform (WHT) [5, 23-25] are the most well known algorithms in this category.

Other multicarrier systems just like OFDM, have as basic drawback the high PAPR of the signal, that degrades the power amplification efficiency. For instance, the high PAPR in filter bank multi-carrier with offset quadrature amplitude modulation (FBMC-OQAM) can significantly reduce power efficiency and performance. However, FBMC-OQAM signals have a very totally different signal structure compared with the OFDM signals. Therefore, other PAPR reduction techniques such as a sliding window tone reservation active constellation extension (SW-TRACE) technique should be applied [26].

Still PAPR reduction techniques do not achieve constant envelope signals and the PAPR reduction may introduce also distortion in the resulting signal, which is the case of clipping.

Due to lower PAPR, single carrier with frequency domain equalization (SC-FDE) is suitable for broadband communications over severely time-dispersive channels and severe power constraints [27, 28]. Although the PAPR problem is less serious with SC-FDE than with MC schemes, a quasi-linear power amplifier is still required. It is known that class D or E amplifiers can have very high amplification efficiencies, together with low-cost implementations. However, since these amplifiers are strongly nonlinear, they should only be employed for signals with constant or quasi-constant envelope.

In the documents [29-30] a linear amplification with nonlinear components (LINC) is disclosed. This technique separates the input signal in two constant-envelope branches to be amplified separately by two highly efficient grossly non linear (NL) amplifiers (e.g., class D and E amplifiers).

The LINC transmitter scheme is limited by the envelope characteristics of its input signal. Since the amplitude information of the bandlimited signal is embedded in the phase of the LINC components, a highly fluctuating envelope produces a constant envelope LINC component with high phase content, which is what causes the LINC components' spectrum to spread. Contrarily to LINC there is no spectrum spread in the $N_m \leq N_b$ components's, since their bandwidth depends only on the pulse shape adopted in each modulator. Neither the amplitude information of the bandlimited signal is embedded in the phase of the $N_m \leq N_b$ components, since they are defined as a function of the quantization symbols of the quantization constellation that is defined, for each signal, according to the dynamic range of the time domain samples of the MC signal or SC signal and the intended quantization error $\varepsilon_{QT}$.

Document [31] discloses a LINC transmitter, which employs a loop-up table (LUT) based ring-type magnitude modulation (RMM) method to confine the envelope of an offset quadrature phase shift keying (OQPSK) signal that is fed to the LINC structure between two specified boundaries. It is shown that by reducing the envelope's dynamic range, the broad LINC components' spectrum is significantly narrowed, thus allowing to combine efficiently the LINC components using a passive combiner, which guarantees a bandlimited reconstructed signal. Contrarily to the method disclosed in [31] the amplification apparatus disclosed in present application does not need to reduce the dynamic range of the time domain samples of the analog signal, since there is no dependence of the spectrum of the quantized amplified signal to the dynamic range of the time domain samples. Only the size of the quantization constellation may depend on the dynamic range of the quantizer inputs, since the size of the quantization alphabet can be adjusted according to the dynamic range and the intended $\varepsilon_{QT}$.

In [32] it is disclosed a method that allow to represent the variable envelope signals associated to large constellations as the sum of several polar components, that are amplified and transmitted by a separate antenna within a massive multi-input multi-output (MIMO) scheme. The power amplification apparatus proposed in this application follows a different approach since it is applied to the quantized values of the time domain samples of the signal's envelope. Therefore, the quantization's constellation should be defined in terms of the dynamic range of the time domain signal's samples and the maximum intended quantization error $\varepsilon_{QT}$ in the quantization process. Since in MC modulations the dynamic range of the envelope depends on the number of sub-carriers and the modulation adopted for each sub-carrier and in SC depends on the adopted modulation, the quantization alphabet symbol $\mathfrak{S} = \{s_0, s_1, \ldots, s_{M-1}\}$, may vary with the number of sub-carriers and modulation adopted and the size of the alphabet $M=2^{N_b}$ only depends on number of quantization bits. Thus, there is no direct relation between the quantization constellation and the modulation applied to signal whose time domain samples are quantized. Hence, the amplification process disclosed here implements a linear amplification of a signal with a variant envelope through the transformation of the time domain samples' values into a quantization constellation and the decomposition of the quantized symbol output as a sum of constant envelope signals that can be amplified by nonlinear amplifiers. Moreover, since the quantizer inputs are time domain samples of a signal's envelope, this decomposition can be applied to any signal and do not have a specific constellation as a target.

In [33] it is disclosed a method of transmitting data based on an M-QAM modulation with linear amplification using nonlinear amplifiers. The power amplification apparatus proposed in this application is not restricted to a particular modulation or constellation, and can be applied to both MC and SC signals, since it uses the $M=2^{N_b}$ quantized values of the samples of these signals to be decomposed into $N_m \leq N_b$ polar components that are amplified separately. Also in the amplification method disclosed in this application the number of polar components is defined in terms of the dynamic range of the signals' samples, the quantization error $\varepsilon_{QT}$ and the number of quantization bits $N_b$.

In [34] are disclosed methods for nonlinear coded 16-OQAM schemes, based on two nonlinear OQPSK signals specially designed to allow higher amplification efficiency due to its robustness against nonlinear distortions. The power amplification apparatus disclosed in the present application implements the linear amplification of SC or MC signal with a variant envelope through the transformation of the time domain samples' values of the signal's envelope into a symbol from a quantization constellation followed by the decomposition of the quantized symbol as a sum of constant envelope signals that can be amplified by nonlinear amplifiers. Thus, since it can be employed to any set of samples of a SC signal or any set of IFFT samples from a MC signal, the power amplification apparatus of the present disclosure does not have any format constraints associated to the pulse shapes and durations that affect the decomposition done in [34], neither nonlinear distortion. Also the number of components is not limited by two, since it is only defined by the number of quantization bits $N_b$ used during the quantization of the signal's samples.

In [35] are disclosed pragmatic frequency domain equalization (FDE) receivers that have low complexity but allow excellent performance, even for large QAM constellations and highly non-uniform offset constellations. The power amplification apparatus disclosed here, applies a generic decomposition on polar components to the quantized values of the samples from any SC or MC signal and it is not restricted to the serial OQPSK format described in [37] and [34].

Document [38] discloses a power amplification apparatus based on one amplifier that performs an inverse fast Fourier transformation on data allocated to a plurality of sub-carriers, converts time-domain data output in parallel from the inverse fast Fourier transformation into a time-domain analog signal, and performs a power amplification of the time-domain analog signal, with saturation output level of the power amplification adjustable in accordance with a switching signal. The amplification apparatus disclosed in this application is rather different since it performs a linear amplification of the components in which the quantized values of the samples $s(t=nT_s)=s(n)$ of the complex envelope of a SC signal or MC signal are decomposed. For example, for a MC signal the samples are given by $$s(t = nT_s) = s(n) = \sum_{k=0}^{N-1} S(k) e^{j2\pi \left( f_c nT_s + \frac{nT_s k}{N} \right)},$$

where N is the size of the IFFT and S(k) represents a frequency domain sample, $T_s$ represents the sample time interval, $nT_s$ is the sample time instant and $f_c$ is the carrier frequency, are transformed into a finite set of quantized symbols by a quantizer with $N_b$ bits and $M=2^{N_b}$ quantization levels. The amplitude of the samples of the input signal is quantized into a quantized symbol, $s_{n,QT}$ belonging to a finite set of symbols by a quantizer with $M=2^{N_b}$ quantization levels. The quantization bits $(\beta_n^{(N_b-1)}, \beta_n^{(N_b-2)}, \ldots, \beta_n^{(1)}, \beta_n^{(0)})$ are transformed into polar form $b_n^{(m)}=(-1)^{\beta_n^{(m)}}$ that are mapped in the $N_m \leq N_b$ polar components in which the quantization symbol can be represented. The finite set of quantized symbols $\mathfrak{S} = \{s_0, s_1, \ldots, s_{M-1}\}$ where M is the number of constellation symbols, follows the rule $$(\beta_n^{(N_b-1)}, \beta_n^{(N_b-2)}, \ldots, \beta_n^{(1)}, \beta_n^{(0)}) \mapsto s_{n,QT} \in \mathfrak{S},$$

with $(\beta_n^{(N_b-1)}, \beta_n^{(N_b-2)}, \ldots, \beta_n^{(1)}, \beta_n^{(0)})$ denoting the binary representation of n with $N_b=\log_2(M)$ bits. The quantization levels are mapped into $N_m$ polar components that are the result of the decomposition of quantization symbol $s_{n,QT}$ into polar components given by $$s_{n,QT} = g_0 + g_1 b_n^{(0)} + g_2 b_n^{(1)} + g_3 b_n^{(0)} b_n^{(1)} + g_4 b_n^{(1)} + \ldots$$

$$= \sum_{i=0}^{N_m-1} g_i \prod_{m=0}^{N_m-1} (b_n^{(m)})^{\gamma_{m,i}} = \sum_{i=0}^{N_m-1} g_i b_n^{eq(i)},$$

with $(\gamma_{N_m-1,i}, \gamma_{N_m-2,i} \cdots \gamma_{1,i}, \gamma_{0,i})$ denoting the binary representation of i, $b_n^{(m)}=(-1)^{\beta_n^{(m)}}$ denoting the polar representation of the bit $\beta_n^{(m)}$, $b_n^{eq(i)}=\prod_{m=0}^{N_m-1}(b_n^{(m)})^{\gamma_{m,i}}$ denoting the i'th polar component of $s_{n,QT}$ and $N_m$ is the number of non-zero $g_i$ coefficients of the referred decomposition equation. Next each one of the $N_m$ polar components is modulated as a binary phase shift keying (BPSK) signal, with a pulse shape selected to assure the best trade-off between spectral and power efficiency. The corresponding signals are then separately amplified by $N_m$ nonlinear amplifiers. The $N_m$ amplifiers' outputs then can be summed by a combiner before being transmitted to the channel or can be directly transmitted to the channel by a set of $N_m$ transducers each one directly connected to each amplification branch.

In [39] it is disclosed a power amplification apparatus that performs an IFFT on data allocated to a plurality of subcarriers, converts time domain data output in parallel from IFFT into time domain analog signal which is amplified by an amplifier with the saturation level controlled by a switching signal. For each block the amplitude is compared with a previous threshold and the saturation output is adjusted based on an output comparison result. Contrarily to the amplification apparatus disclosed in this application no quantization is used to quantize the in-phase and quadrature values of the envelope and each component is directly amplified by an amplifier with a saturation level controlled by a switching signal. Nonlinear distortion due power amplification still is minimized by controlling dynamically the saturation level of the amplifiers employed in the amplification of the real and imaginary parts of the signal. There is no quantization of the real and imaginary parts of the input signal and the decomposition of the quantized values into a sum of constant envelope signals that are amplified with nonlinear amplifiers.

In [40] it is disclosed a super linear feedforward amplifier, where nonlinear effects are compensated through an error cancelation circuit loop, that subtracts the error from the amplified signals to generate a linearized output. An equalization it is also applied to the amplified signals to correct gain and phase distortions introduced by the power amplifier. It is employed a digital correction block controlled adaptively by feedback signals, received from the signal to be amplified and error cancelation loops. No feedback loop and equalization are employed in the amplification apparatus disclosed in the present application, since distortion effects due to amplification are avoided by the decomposition of the signals into constant envelope components that are amplified by nonlinear amplifiers. A finite set of values for the envelope of the input signal is also obtained through a quantizer. Contrarily to the apparatus of [40] in the amplification apparatus disclosed in the present application, distortion effects are only due to the quantization error associated to the quantized values used to represent the in-phase and quadrature components of the input signal.

INFORMATION DISCLOSURE STATEMENTS

Patents and publications relevant to the patentability of the instant claims, concerning a quantizer based amplification method.

[1] D. Falconer, S. Ariyavisitakul, A. Benyamin-Seeyar, and B. Eidson, "Frequency Domain Equalization for Single-Carrier Broadband Wireless Systems", IEEE Comm. Mag., vol. 4, no. 4, pp. 58-66, April 2002.

[2] T. S. Rappaport, et al., "Millimeter wave mobile communications for 5 g cellular: it will work!", Access, IEEE, vol. 1, no., pp. 335-349, 2013.

[3] S. Rangan, T. S. Rappaport, and E. Erkip, "Millimeter-wave cellular wireless networks: potentials and challenges", Proceedings of the IEEE, vol. 102, no. 3, pp. 366-385, March 2014.

[4] R. v. Nee and R. Prasad, OFDM for Wireless Multimedia Communications, 1st ed. Norwood, Mass., USA: Artech House, Inc., 2000.

[5] M. Ahmed, S. Boussakta, B. Sharif, and C. Tsimenidis, "OFDM based on low complexity transform to increase multipath resilience and reduce PAPR", IEEE Transactions on Signal Processing, vol. 59, no. 12, pp. 5994-6007, December 2011.

[6] A. Mallet, A. Anakabe, J. Sombrin, and R. Rodriguez, "Multiport-amplifier-based architecture versus classical architecture for space telecommunication payloads", IEEE Transactions on Microwave Theory and Techniques, vol. 54, no. 12, pp. 4353-4361, December 2006.

[7] A. Bahai, M. Singh, A. Goldsmith, and B. Saltzberg, "A new approach for evaluating clipping distortion in multicarrier systems", IEEE Journal on Selected Areas in Communications, vol. 20, no.

5, pp. 1037-1046, June 2002. [8] L. Zhang, L.-L. Kuang, Z.-Y. Ni, and J.-H. Lu, "Performance evaluation for OFDM and SC-FDE systems with high power amplifier", in IET International Communication Conference on Wireless Mobile and Computing (CCWMC 2009), December 2009, pp. 348-352.

[9] X. Zhu, H. Hu, and Y. Tang, "Descendent clipping and filtering for cubic metric reduction in OFDM systems", Electronics Letters, vol. 49, no. 9, pp. 599-600, April 2013.

[10] X. Zhu, W. Pan, H. Li, and Y. Tang, "Simplified approach to optimized iterative clipping and filtering for PAPR reduction of OFDM signals", IEEE Transactions on Communications, vol. 61, no. 5, pp. 1891-1901, May 2013.

[11] M. Paredes and M. Fernandez-Getino Garcia, "Energy efficient peak power reduction in OFDM with amplitude predistortion aided by orthogonal pilots", IEEE Transactions on Consumer Electronics, vol. 59, no. 1, pp. 45-53, February 2013.

[12] M. Gay, A. Lampe, and M. Breiling, "An adaptive PAPR reduction scheme for OFDM using SLM with clipping at the transmitter, and sparse reconstruction at the receiver", in IEEE China Summit International Conference on Signal and Information Processing (ChinaSIP), 2014, July 2014, pp. 678-682.

[13] M. Hu, Y. Li, W. Wang, and H. Zhang, "A piecewise linear companding transform for PAPR reduction of OFDM signals with companding distortion mitigation", IEEE Transactions on Broadcasting, vol. 60, no. 3, pp. 532-539, September 2014.

[14] Y. Wang, J. Ge, L. Wang, J. Li, and B. Ai, "Nonlinear companding transform for reduction of peak-to-average power ratio in OFDM systems", IEEE Transactions on Broadcasting, vol. 59, no. 2, pp. 369-375, June 2013.

[15] J. Xiao, J. Yu, X. Li, Q. Tang, H. Chen, F. Li, Z. Cao, and L. Chen, "Hadamard transform combined with companding transform technique for PAPR reduction in an optical direct-detection OFDM system", IEEE/OSA Journal of Optical Communications and Networking, vol. 4, no. 10, pp. 709-714, October 2012.

[16] P. Varahram and B. Ali, "A crest factor reduction scheme based on recursive optimum frequency domain matrix", IEEE Transactions on Consumer Electronics, vol. 60, no. 2, pp. 179-183, May 2014.

[17] S. Adegbite, S. McMeekin, and B. Stewart, "Low complexity data decoding using binary phase detection in SLM-OFDM systems", Electronics Letters, vol. 50, no. 7, pp. 560-562, March 2014.

[18] N. Singh, A. Bhadu, and A. Kumar, "Combined SLM and tone reservation for PAPR reduction in OFDM systems", in Confluence 2013: The Next Generation Information Technology Summit (4th International Conference), Noida, Uttar Pradesh, India September 2013, pp. 274-277.

[19] S. Meymanatabadi, J. Niya, and B. Tazehkand, "Multiple recursive generator-based method for peak-to-average power ratio reduction in selected mapping without side information", China Communications, vol. 10, no. 8, pp. 68-76, August 2013.

[20] V. Sudha and D. Sriram Kumar, "PAPR reduction of OFDM system using pts method with different modulation techniques", in International Conference on Electronics and Communication Systems (ICECS), 2014, February 2014, pp. 1-5.

[21] E. Kalaiselvan, P. Elavarasan, and G. Nagarajan, "PAPR reduction of OFDM signals using pseudo random PTS without side information", in International Conference on Communications and Signal Processing (ICCSP), Melmaruvathur, Tamilnadu, India, April 2013, pp. 29-33.

[22] H.-L. Hung and Y.-F. Huang, "Peak-to-average power ratio reduction in orthogonal frequency division multiplexing system using differential evolution-based partial transmit sequences scheme", IET Communications, vol. 6, no. 11, pp. 1483-1488, July 2012.

[23] Z. Dlugaszewski and K. Wesolowski, "WHT/OFDM—an improved ofdm transmission method for selective fading channels", in Symposium on Communications and Vehicular Technology, 2000. SCVT-2000, Oct. 19, 2000, IMEC, Leuven (BE), pp. 144-149.

[24] S. Wang, S. Zhu, and G. Zhang, "A walsh-hadamard coded spectral efficient full frequency diversity OFDM system", IEEE Transactions on Communications, vol. 58, no. 1, pp. 28-34, January 2010.

[25] M. Al-Attraqchi, S. Boussakta, and S. Le-Goff, "An enhanced OFDM/OQAM system exploiting walsh-hadamard transform", in Vehicular Technology Conference (VTC Spring), 2011 IEEE 73rd, May 2011, pp. 1-5.

[26] S. Lu, Q. Daiming, and H. Yejun, "Sliding window tone reservation technique for the peak-to-average power ratio reduction of FBMC-OQAM signals", IEEE Wireless Communications Letters, Vol. 1, no. 4, pp. 268-271, 2012.

[27] D. Cox, "Linear amplification with nonlinear components", IEEE Transactions on Communications, vol. 22, no. 12, pp. 1942-1945, December 1974.

[28] R. Dinis, P. Montezuma, N. Souto, and J. Silva, "Iterative Frequency-Domain Equalization for General Constellations", 33rd IEEE Sarnoff Symposium 2010, Princeton, USA, April 2010.

[29] A. Birafane, M. El-Asmar et al., "Analyzing LINC Systems", Microwave Magazine, IEEE, vol. 11, no. 5, pp. 59-71, August 2010.

[30] R. Dinis and A. Gusmão, "Nonlinear signal processing schemes for OFDM modulations within conventional or LINC transmitter structures", European Transactions on Telecommunications, vol. 19, no. 3, pp. 257-271, April 2008.

[31] A. S. Simões, P. Bento, M. Gomes, R. Dinis and V. Silva, "Efficient LINC amplification for 5G through ring-type magnitude modulation", Proc IEEE Globecom 2015 Workshop on Mobile Communications in Higher Frequency Bands (MCHFB), San Diego, United States, December 2015.

[32] P. Montezuma, R. Dinis and D. Marques, "Robust Frequency-Domain Receivers for A Transmission Technique with Directivity at the Constellation Level", IEEE VTC/2014 (Fall), Vancouver, Canada, September 2014.

[33] V. Astucia, "Linear amplification with multiple nonlinear devices", Faculty of Science and Technology, New University of Lisbon.

[34] P. Montezuma, et al., "Power efficient coded 16-OQAM schemes over nonlinear transmitters", 34th IEEE Sarnoff Symposium, May 3, 2011.

[35] M. Luzio, et al., "Efficient Receivers for SC-FDE Modulations with offset", IEEE Military Communications Conference 2012, MILCOM 2012.

[36] A. Gusmão, V. Gonçalves and N. Esteves, "A novel approach to modeling of OQPSK-type digital transmission over nonlinear radio channels", IEEE Journal on Selected Areas in Communications, vol. 15, no. 4, pp. 647-655, 1997.

[37] R. Dinis, P. Montezuma, N. Souto, and J. Silva, "Iterative Frequency-Domain Equalization for General Constellations", 33rd IEEE Sarnoff Symposium 2010, Princeton, USA, April 2010.

[38] S. Kusunoki, "Power amplification apparatus, OFDM modulation apparatus, and distortion reduction method for power amplification apparatus", US patent, US 2001/0310990 A1.

[39] S. Kusunoki, "Power amplification apparatus, OFDM modulation apparatus, wireless transmission apparatus, and distortion reduction method for power amplification apparatus", Us patent, US 2011/0310990 A1.

[40] Y. Shalom, D. Arison and K. Kaufman, "Super-linear multi-carrier power amplifier", U.S. Pat. No. 6,166,601, Dec. 26, 2000.

BRIEF SUMMARY OF THE INVENTION

The apparatus for linear power amplification with nonlinear amplifiers presented herein implements a linear amplification of a bandpass signal with non-constant envelope (e.g., a filtered SC-signal, an SC signal based on large, non-constant-envelope, constellations or a general MC signal). This amplification apparatus is based on the quantization of the samples of the signal's complex envelope.

The amplification apparatus receives an input signal with complex envelope s(t), which is sampled in 100 to obtain the time domain samples $s(nT_s)=s(n)$ of, where and $T_s$ the sample time interval and $nT_s$. is the sample time instant. In general, the time domain samples s(n) of the signal s(t) may have an infinite number of amplitude levels within the dynamic range of the signal. In 101, by performing the amplitude quantization of the time domain samples, the amplitude of each sample s(n) is transformed into a discrete amplitude value $s_{n,QT}$ taken from a finite alphabet of $2^{N_b}$ possible quantization symbols from a quantizer that can be uniform or non-uniform. This value is represented as a sum of $N_m$ polar components, and each one is independently amplified by a different nonlinear amplifier. This can be done separately for the real and imaginary parts of the complex envelope.

The present application describes an amplification apparatus comprising the following steps:

The input signal is sampled to generate the corresponding time domain samples;

each sample s(n) is quantized by the quantizer with $N_b$ quantization bits 101 that correspond to a quantization value $s_{n,QT}$ taken from a finite alphabet of $2^{N_b}$ possible quantization symbols;

in the polar converter 102 the quantization bits ($\beta_n^{(N_b-1)}$, $\beta_n^{(N_b-2)}$, ..., $\beta_n^{(1)}$, $\beta_n^{(0)}$) are converted into polar form $(b_n^{(N_b-1)}, b_n^{(N_b-2)}, \ldots, b_n^{(1)}, b_n^{(0)})$ by $b_n^{(m)}=(-1)^{\beta_n^{(m)}}$. The finite set of quantized symbols $\mathfrak{S}=\{s_0, s_1, \ldots, s_{M-1}\}$, where $M=2^{N_b}$ is the number of constellation symbols, follows the rule $$(\beta_n^{(N_b-1)}, \beta_n^{(N_b-2)}, \ldots, \beta_n^{(1)}, \beta_n^{(0)}) \mapsto s_{n,QT} \in \mathfrak{S}$$

with $(\beta_n^{(N_b-1)}, \beta_n^{(N_b-2)}, \ldots, \beta_n^{(1)}, \beta_n^{(0)})$ denoting the binary representation of n with $N_b = \log_2(M)$ bits;

in 103 the polar version of the quantization bits $(b_n^{(N_b-1)}, b_n^{(N_b-2)}, \ldots, b_n^{(1)}, b_n^{(0)})$ are mapped in $N_m \leq N_b$ polar components, that are the result of the decomposition of quantization value $s_{n,QT}$ into polar components given by $$s_{n,QT} = g_0 + g_1 b_n^{(0)} + g_2 b_n^{(1)} + g_3 b_n^{(0)} b_n^{(1)} + g_4 b_n^{(2)} + \ldots$$

$$= \sum_{i=0}^{N_m-1} g_i \prod_{m=0}^{N_m-1} (b_n^{(m)})^{\gamma_{m,i}} = \sum_{i=0}^{N_m-1} g_i b_n^{eq(i)},$$

with $(\gamma_{N_m-1,i}, \gamma_{N_m-2,i}, \ldots, \gamma_{1,i}, \gamma_{0,i})$ denoting the binary representation of i, $b_n^{(m)}=(-1)^{\beta_n^{(m)}}$ denoting the polar representation of the bit $\beta_n^{(m)}$, $b_n^{eq(i)} = \prod_{m=0}^{N_m-1}(b_n^{(m)})^{\gamma_{m,i}}$ denoting the i'th polar component of $s_n$ and $N_m$ is the number of non-zero $g_i$ coefficients of the referred decomposition equation;

each of the $N_m$ polar component is modulated as a BPSK signal in 104, being each of these $N_m$ BPSK specially designed to have good tradeoffs between reduced envelope fluctuations and compact spectrum (e.g., a GMSK (Gaussian Minimum Shift Keying) signal). Note that for the $i^{th}$ branch the peak amplitude of the corresponding BPSK signal is given by the corresponding $|g_i|$;

In each branch the resulting signals are submitted to a phase shifter 105 and are amplified by a set of $N_m$ nonlinear amplifiers 107, before being transmitted by 108. The $N_m$ amplifiers' outputs then can be summed by a combiner before being transmitted to the channel or can be directly transmitted to the channel by a set of $N_m$ antennas, a set of hydrophones or a set of laser diodes each one connected to each amplification branch depending on the transmitting channel that is being considered. 108 can be implemented as a combiner followed by a transducer that can be an antenna or a laser diode or a hydrophone or as a set of $N_m$ transducers that can be $N_m$ antennas, $N_m$ hydrophones or $N_m$ laser diodes, where each transducer is directly connected to each amplification branch.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF DRAWINGS

The various aspects of embodiments disclosed here, including features and advantages of the present invention outlined above are described more fully below in the detailed description in conjunction with the drawings, where like reference numerals refer to like elements throughout, in which:

FIG. 1 shows a diagram of the linear power amplification apparatus' structure where the input signals are sampled in 100 and the resulting quantization bits of 101 from the quantization of the signal's time domain samples are subsequently converted into $N_m$ antipodal format by the polar decomposition converter 102. These antipodal are mapped into $N_m$ polar sequences in 103 that are the inputs of BPSK modulators 104, whose outputs are continuous time BPSK signals that are the inputs of the phase shifter 105, and amplified by $N_m$ nonlinear amplifiers 106. The $N_m$ amplifiers' outputs are the inputs of 108. 108 can be implemented as a combiner followed by a transducer that can be an antenna or a laser diode or a hydrophone or as a set of $N_m$ transducers that can be a set of $N_m$ antennas, $N_m$ hydrophones or $N_m$ laser diodes, where each transducer is directly connected to each amplification branch. Depending on 108 structure the $N_m$ amplifiers' outputs can be summed by a combiner before being transmitted to the channel or can be directly transmitted to the channel by a set of $N_m$ transducers or other type of transducers, depending on the transmitting channel that is being considered.

DETAILED DESCRIPTION OF THE INVENTION

The present application describes a linear amplification apparatus using a quantizer combined with a decomposition of the quantized symbols into $N_m$ polar components that are amplified individually by a nonlinear amplifier. Referring to the figures, it will now be described technology using different embodiments of the same technology, which is not intended to limit the scope of protection of this application. The embodiments are composed by a method of sequential steps as described below.

The apparatus for linear power amplification with nonlinear amplifiers uses as input for the quantizer the time domain samples of the complex envelope that can be obtained from a MC or SC signal. The values of the samples of variable envelope signals are quantized by $N_b$ quantization bits that are converted into polar components in which the quantization symbol is decomposed as the sum of several polar components [37]. Each one is modulated as a serial OQPSK signal [38] with reduced envelope fluctuations or as constant envelope signal before being amplified by a separate amplifier.

The basic structure of the apparatus for linear power amplification with nonlinear amplifiers considered in this application is depicted in FIG. 1. The input signals of the power amplification apparatus are sampled in 100 to generate the time domain samples $s(nT_s)=s(n)$.

In 101, by performing the amplitude quantization of the time domain samples, the amplitude of each sample $s(n)$ is transformed into a quantized symbol $s_{n,QT}$ taken from a finite alphabet of $2^{N_b}$ possible quantization symbols or levels. The power amplification apparatus disclosed in the present application employs a sampler, represented by 100, and a quantizer, that can be uniform or non-uniform, represented by 101, with $N_b$ quantization bits and $M=2^{N_b}$ quantization levels. The $N_b$ quantization bits are employed in the definition of $N_m \leq N_b$ polar components in which each quantization symbol can be decomposed. In the polar converter of 102 the quantization bits $(\beta_n^{(N_b-1)}, \beta_n^{(N_b-2)}, \ldots, \beta_n^{(1)}, \beta_n^{(0)})$ are converted into polar form $(b_n^{(N_b-1)}, b_n^{(N_b-2)}, \ldots, b_n^{(1)}, b_n^{(0)})$ by $b_n^{(m)}=(-1)^{\beta_n^{(m)}}$. The finite set of quantized symbols $\mathfrak{S}=\{s_0, s_1, \ldots, s_{M-1}\}$, where $M=2^{N_b}$ is the number of constellation symbols, follows the rule $$(\beta_n^{(N_b-1)}, \beta_n^{(N_b-2)}, \ldots, \beta_n^{(1)}, \beta_n^{(0)}) \mapsto s_{n,QT} \in \mathfrak{S},$$

with $(\beta_n^{(N_b-1)}, \beta_n^{(N_b-2)}, \ldots, \beta_n^{(1)}, \beta_n^{(0)})$ denoting the binary representation of n with $N_b = \log_2(M)$ bits.

Next, in 103 the polar version of the quantization bits $(b_n^{(N_b-1)}, b_n^{(N_b-2)}, \ldots, b_n^{(1)}, b_n^{(0)})$ are mapped in $N_m \leq N_b$ polar components, that are the result of the decomposition of quantization value $s_{n,QT}$ into polar components given by $$s_{n,QT} = g_0 + g_1 b_n^{(0)} + g_2 b_n^{(1)} + g_3 b_n^{(0)} b_n^{(1)} + g_4 b_n^{(2)} + \ldots$$

$$= \sum_{i=0}^{N_m-1} g_i \prod_{m=0}^{N_m-1} (b_n^{(m)})^{\gamma_{m,i}} = \sum_{i=0}^{N_m-1} g_i b_n^{eq(i)},$$

with $(\gamma_{N_m-1,i}, \gamma_{N_m-2,i} \cdots \gamma_{1,i} \gamma_{0,i})$ denoting the binary representation of i, $b_n^{(m)}=(-1)^{\beta_n^{(m)}}$ denoting the polar representation of the bit $\beta_n^{(m)}$, $b_n^{eq(i)}=\prod_{m=0}^{N_m-1}(b_n^{(m)})^{\gamma_{m,i}}$ denoting the i'th polar component of $s_n$ and $N_m$ is the number of non-zero $g_i$ coefficients of the referred decomposition equation.

Each one of the $N_m$ polar components is modulated as a BPSK signal in 104, being each of these $N_m$ BPSK specially designed to have good tradeoffs between reduced envelope fluctuations and compact spectrum (e.g., a GMSK signal). Note that the pulse shape employed in 104 can be selected to achieve high spectral efficiency and constant envelope. For the i-th branch the peak amplitude of the corresponding BPSK signal is given by the corresponding $|g_i|$.

Next, in each branch the resulting signals are submitted to a phase shifter 105 where the signal obtained at the output of BPSK modulator 104 suffers a phase rotation before being amplified by the nonlinear amplifier 106. Thus, in each branch, the signal at the BPSK modulator's output is multiplied by a complex coefficient in the phase shifter 105 and then amplified by a nonlinear amplifier 106, which can operate in saturated mode or near to it. The amplification stage 107 is composed by $N_m$ amplifiers 106 in parallel whose outputs are the inputs of 108. 108 can be implemented as a combiner followed by a transducer connected to an antenna or a laser diode or a hydrophone or as a set of $N_m$ transducers that can be $N_m$ antennas, $N_m$ hydrophones or $N_m$ laser diodes, where each transducer is directly connected to each amplification branch. Depending on 108 structure the $N_m$ amplifiers' outputs can be summed by a combiner before being transmitted to the channel or can be directly transmitted to the channel by a set of $N_m$ transducers that can be $N_m$ antennas, or $N_m$ hydrophones or $N_m$ laser diodes or other type of transducers depending on the transmitting channel that is being considered.

In another embodiment, the in-phase and quadrature components of the complex envelope samples of the input signals are separated and quantized by two independent quantizers each one with $N_b^I$ and $N_b^Q$ quantization bits that correspond to two finite alphabets of $2^{N_b^I}$ and $2^{N_b^Q}$ of possible quantization symbols for the in-phase quantized value $s_{n,QT}^I$ and the quadrature quantized value $s_{n,QT}^Q$ respectively. The in-phase quantization value $s_{n,QT}^{IN}$ and the quadrature quantization value $s_{n,QT}^Q$ are decomposed as a sum of $N_m^I \leq N_b^I$ and $N_m^Q \leq N_b^Q$ polar components, respectively, and amplified by $N_m^I$ and $N_m^Q$ amplifiers before being combined in a combiner with $N_m^I + N_m^Q$ inputs.

In another embodiment, the $N_m$ quantization bits can be transformed into $N_m/2$ sets of two polar components that modulated by a OQSPK or a MSK (Minimum Shift Keying) signal or other constant envelope signal, which is subsequently amplified by the non-linear amplifier 106, which can operate in saturated mode or near to it. In this case the amplification stage 107 is composed by $N_m/2$ amplifiers 106 in parallel whose outputs are the inputs of 108.

While preferred embodiments of the present disclosure have been described above, the present disclosure is not limited to the specific configurations described above. Various variations and modifications may be made without departing from the scope of the present disclosure. It should be understood by those skilled in the art that various modifications, combinations, sub-combinations and alterations may occur depending on design requirements and other factors insofar as they are within the scope of the appended claims or the equivalents thereof.

What is claimed is:

1. An apparatus for quantized linear amplification with nonlinear amplifiers comprising:
    A sampler that generates the time domain samples obtained from the complex envelope of a single carrier (SC) or multicarrier (MC) input signal;
    at least one quantizer generating the quantization bits that correspond to the quantized values of the time domain samples of the input signal;
    at least one mapper that generates a set of periodic signals with same frequency of the carrier frequency and different constant amplitudes in which the quantized amplitude value can be decomposed and that converts the quantization bits received from the quantizer into polar sequences that control the phases of the component signals in which the quantized symbol is decomposed;
    at least a set of amplification branches in parallel with the number equal at least to the half of the quantization bits, each one with a modulator that uses a polar sequence obtained from a quantization bit, a phase shifter and an amplifier that amplifies each one of the signals in which the quantized signal is decomposed;
    one combiner that combines the amplified signals connected to one transducer or a set of $N_m$ transducers directly connected to each amplification branch that generates an amplified version of the quantized signal.

2. An apparatus for quantized linear amplification with nonlinear amplifiers of claim 1, wherein each sample s(n) of the complex envelope is quantized in $N_b$ quantization bits that correspond to a quantization value $s_{n,QT}$ taken from a finite alphabet of $2^{N_b}$ possible quantization symbols, that is decomposed into the $N_m \leq N_b$ polar components with different constant amplitudes that are each one modulated as a BPSK signal specially designed to have good tradeoffs between reduced envelope fluctuations and compact spectrum (e.g., a GMSK (Gaussian Minimum Shift Keying) signal) and amplified by a set of $N_m$ nonlinear amplifiers).

3. An apparatus for quantized linear amplification with nonlinear amplifiers of claim 1, wherein each sample s(n) of the complex envelope is decomposed Into the in-phase and quadrature components that are quantized as $s_{n,QT}^I$ and $s_{n,QT}^Q$, respectively, by two independent quantizers, each one with $N_b^I$ and $N_b^Q$ quantization bits that correspond to two finite alphabets of $2^{N_b^I}$ and $2^{N_b^Q}$ of possible quantization symbols, that are decomposed into $N_m^I \leq N_b^I$ and $N_m^Q \leq N_b^Q$ polar components with different constant amplitudes by two mappers and amplified by $N_m^I$ and $N_m^Q$ amplifiers, respectively.

4. An apparatus for quantized linear amplification with nonlinear amplifiers of claim 1, wherein the mapping of the quantized bits can be done by a mapper that makes directly the conversion of the quantization bits into a set of BPSK signals with different constant amplitudes or other constant envelope signals and uses the quantization bits to control the phases of the constant envelope signals components.

5. An apparatus for quantized linear amplification with nonlinear amplifiers of claim 1, wherein the mapping of the quantized bits can be done by mappers that make directly the conversion of dibits into a set of QPSK (Quadrature Phase Shift Keying) or Offset-QPSK components with different and constant amplitudes or other constant envelope components, that are separately amplified.

6. An apparatus for quantized linear amplification with nonlinear amplifiers of claim 1, wherein each sample s(n) of the complex envelope is quantized in $N_b$ quantization bits that correspond to a quantization value $s_{n,QT}$ taken from a finite alphabet of $2^{N_b}$ possible quantization symbols, where each dibit of the set of $N_b/2$ dibits is modulated by a OOSPK signal or a MSK signal with constant amplitude or other signal specially designed to have good tradeoffs between reduced envelope fluctuations and compact spectrum (e.g., a GMSK signal) and amplified by a set of $N_m/2$ nonlinear amplifiers.

* * * * *